United States Patent
Chao et al.

(10) Patent No.: US 7,994,511 B2
(45) Date of Patent: Aug. 9, 2011

(54) SEMICONDUCTOR STRUCTURE HAVING MULTILAYER OF POLYSILICON AND DISPLAY PANEL APPLIED WITH THE SAME

(75) Inventors: Chih-Wei Chao, Taipei (TW); Mao-Yi Chang, Taipei (TW)

(73) Assignee: Au Optronics Corp., Hsin-Chu (TW)

( * ) Notice: Subject to any disclaimer, the term of this patent is extended or adjusted under 35 U.S.C. 154(b) by 329 days.

(21) Appl. No.: 12/314,355

(22) Filed: Dec. 9, 2008

(65) Prior Publication Data
US 2009/0127554 A1    May 21, 2009

Related U.S. Application Data

(62) Division of application No. 11/202,178, filed on Aug. 12, 2005, now Pat. No. 7,476,601.

(30) Foreign Application Priority Data

Jan. 25, 2005 (TW) ................ 94102194 A (51) Int. Cl.
*H01L 27/10* (2006.01)
*H01L 29/16* (2006.01)
(52) U.S. Cl. .......... 257/74; 257/E27.07; 257/E29.082
(58) Field of Classification Search .......... 257/66–67, 257/70, 72, 74–75, E27.001, E27.07, E29.003, 257/E29.082, E29.106, E29.108
See application file for complete search history.

(56) References Cited

U.S. PATENT DOCUMENTS

| | | | |
|---|---|---|---|
| 4,272,880 A | 6/1981 | Pashley | |
| 5,453,952 A | 9/1995 | Okudaira et al. | |
| 5,976,953 A | 11/1999 | Zavracky et al. | |
| 6,737,672 B2 | 5/2004 | Hara et al. | |
| 6,767,773 B2 | 7/2004 | Sano et al. | |
| 7,115,941 B2 * | 10/2006 | Kato | 257/316 |
| 7,618,852 B2 * | 11/2009 | Jang et al. | 438/149 |
| 2002/0066931 A1 * | 6/2002 | Tamura et al. | 257/359 |
| 2003/0030074 A1 | 2/2003 | Walker et al. | |
| 2003/0089909 A1 * | 5/2003 | Miyairi et al. | 257/59 |
| 2003/0100169 A1 | 5/2003 | Tanaka et al. | |
| 2003/0104682 A1 | 6/2003 | Hara et al. | |
| 2003/0181043 A1 | 9/2003 | Tanada et al. | |
| 2003/0218169 A1 | 11/2003 | Isobe et al. | |
| 2003/0231263 A1 | 12/2003 | Kato et al. | |
| 2004/0042707 A1 | 3/2004 | Imai et al. | |

(Continued)

FOREIGN PATENT DOCUMENTS
CN    1334312 A    2/2002

*Primary Examiner* — Matthew W Such
(74) *Attorney, Agent, or Firm* — Birch, Stewart, Kolasch & Birch, LLP (57) ABSTRACT

A semiconductor structure includes a substrate, a first polysilicon (polysilicon) region, a second polysilicon region, an insulating layer and a third polysilicon region. The first and second polysilicon regions are formed on the substrate and spaced apart by a gap. The insulating layer formed on the substrate covers the first and second polysilicon regions. The third polysilicon region is formed on the insulating layer and disposed above the gap. When the semiconductor structure is applied to a display panel, a grain boundary of the third polysilicon region in a displaying region and a channel of an active layer intersect at an angle, and the grain boundary of the third polysilicon region in a circuit driving region is substantially parallel to the channel of the active layer.

10 Claims, 8 Drawing Sheets

U.S. PATENT DOCUMENTS

| | | |
|---|---|---|
| 2004/0051100 A1 | 3/2004 | Yamazaki et al. |
| 2004/0106237 A1 | 6/2004 | Yamazaki |
| 2004/0140547 A1 | 7/2004 | Yamazaki et al. |
| 2004/0157413 A1 | 8/2004 | Miyairi et al. |
| 2004/0195572 A1 | 10/2004 | Kato et al. |
| 2004/0230685 A1* | 10/2005 | Oishi et al. ................. 257/72 |

* cited by examiner

Attached Figure 1A(RELATED ART)   Attached Figure 1B(RELATED ART)

Attached Figure 2A(RELATED ART)   Attached Figure 2B(RELATED ART)

Attached Figure 3A

Attached Figure 3B

Attached Figure 4A

Attached Figure 4B

Attached Figure 5

Attached Figure 6

Attached Figure 7

SEMICONDUCTOR STRUCTURE HAVING MULTILAYER OF POLYSILICON AND DISPLAY PANEL APPLIED WITH THE SAME

CROSS REFERENCE TO RELATED APPLICATIONS

This application is a Divisional of application Ser. No. 11/202,178, filed Aug. 12, 2005, now U.S. Pat. No. 7,476,601 and claims priority under 35 U.S.C. §119 on Taiwanese Application No. 94102194 filed in the Republic of China on Jan. 25, 2005. The entire contents of which are hereby incorporated by reference in their entirety.

BACKGROUND OF THE INVENTION

1. Field of the Invention

The invention relates in general to a semiconductor structure having a multilayer of polysilicon (poly-Si) and a display panel applied with the same, and more particularly to a semiconductor structure having a multilayer of polysilicon with a specific direction of the grain boundary and a low surface roughness, and a display panel applied with the semiconductor structure.

2. Description of the Related Art

Organic electroluminescent flat panel displays are current-driven elements and the methods for driving the elements may be classified into a passive matrix method and an active matrix method. The active organic light emitting diode (AMOLED) uses a thin film transistor (TFT) in conjunction with a capacitance storage device to control the luminance and gray-scale behaviors of the organic light emitting diode (OLED).

Generally speaking, the manufacturing cost and technological level of the passive organic light emitting diode (PMOLED) is lower. However, the resolution cannot be increased under the limitation of the poor driving current efficiency. In addition, the pixel selected by the scan line is lighted but its luminance cannot be held under the driven mode. Thus, the dimension of the application product is restricted within 5 inches. Due to the capacitance storage signal in the active organic light emitting diode, a pixel still can be held at the original luminance after the scan line has scanned the pixel. So, the OLED does not have to be driven to a very high luminance, and a better lifetime behavior and the high resolution requirement can be achieved. Furthermore, the driving current efficiency of the active organic light emitting diode is more superior to that of the passive organic light emitting diode, and the pixels and electric elements TFTs can be integrated on a glass substrate.

The technology of growing TFTs on the glass substrate may include an amorphous silicon (a-Si) process and a low-temperature polysilicon (LTPS) process. The maximum difference between the LTPS TFT and the a-Si TFT resides in the electric property and the complication of the process. The LTPS TFT possesses a higher carrier mobility, which means that the TFT can provide a more sufficient current but its process is more complicated. On the contrary, the a-Si TFT has poorer carrier mobility but a simpler process than the LTPS TFT.

In the aspect of converting the amorphous silicon into the polysilicon, several crystallizing methods, such as the excimer laser annealing (ELA) technology, the continuous grain silicon (CGS) technology, the sequential lateral solidification (SLS) technology and the metal induced lateral crystallization (MILC) technology, have been developed. The adopted lasers also have many types, such as the excimer laser, the continuous wave (CW) laser, the laser beam pulse, and the like. Compared to the excimer laser annealing method, using the continuous wave laser annealing method can obtain a polysilicon film with a larger die dimension. In general, the larger die has higher carrier mobility. For example, the n-type element has the carrier mobility as high as about 566 $cm^2$/s-V. Thus, in the aspect of converting the amorphous silicon into the polysilicon, the continuous wave laser technology has been greatly noted.

However, it is difficult to control the grain boundary of the polysilicon die formed using the continuous wave laser (CW Laser) annealing method, and the surface of the polysilicon layer is very rough (refer to the attached FIG. 1(a) and the attached FIG. 2(a)), which greatly influences the electric property of the application element. Taking an active layer of a TFT (Thin Film Transistor) element as an example, if the surface of the polysilicon layer in the active layer is very rough (i.e. the surface is uneven), when a gate oxide layer is formed above the polysilicon layer, the oxide layer structure close to the protrusion of the polysilicon layer is changed such that the oxide layer tends to be etched through and the polysilicon layer is exposed during the subsequent etching process. In addition, when a voltage is applied to the TFT, the point discharge phenomenon tends to occur at the protrusion on the rough surface of the polysilicon layer, thereby making the electric behaviors of the elements on the same substrate very unstable. In order to obtain a smoother surface of the polysilicon layer, the prior art still utilizes the excimer laser annealing method to convert the amorphous silicon into the polysilicon.

Figure 1:
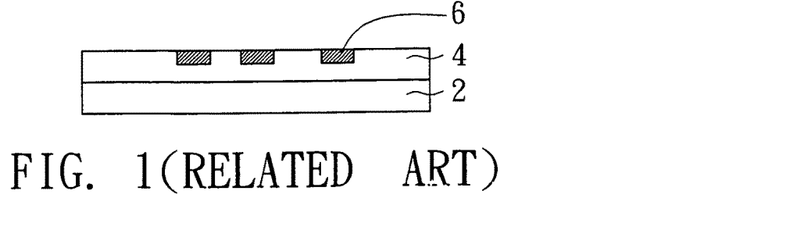
FIG. 1 is a schematic illustration showing a conventional semiconductor structure having a multilayer of polysilicon.
Figure 1A:
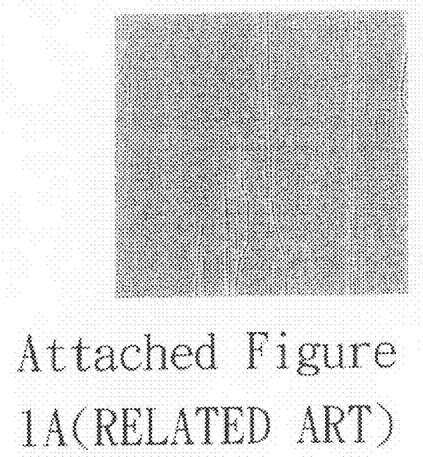
Figure 1B:
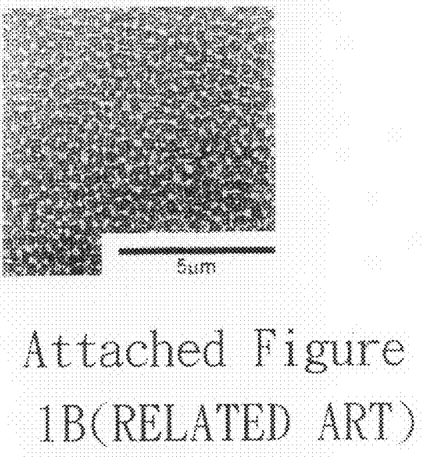

FIG. 1 is a schematic illustration showing a conventional semiconductor structure having a multilayer of polysilicon. As shown in FIG. 1, a patterned insulating layer 4, such as an oxide layer, is formed on a substrate 2. Then, an amorphous silicon layer is deposited above the patterned insulating layer 4. Next, an excimer laser annealing method is used to convert the amorphous silicon layer into a polysilicon layer 6. Although using the excimer laser annealing method can form a polysilicon surface with a low roughness, the formed die is smaller (refer to the attached FIG. 1(b) and attached FIG. 2(b)), the carrier mobility is low, and the electric behavior is poor when it serves as an element on the active layer.

Therefore, it is an important object of the researcher to develop a polysilicon layer with a specific direction of the grain boundary and a low surface roughness such that the element applied with the same can have high carrier mobility and a good and stable electric behavior.

SUMMARY OF THE INVENTION

It is therefore an object of the invention to provide a semiconductor structure having a multilayer of polysilicon and a display panel applied with the same, wherein the more regular grain boundary and the low surface roughness enhance the carrier mobility of the applied display panel and cause the good conductivity.

The invention achieves the above-identified object by providing a semiconductor structure including a substrate, a first polysilicon region formed on the substrate, a second polysilicon region formed on the substrate and spaced apart from the first polysilicon region by a gap, an insulating layer formed on the substrate to cover the first polysilicon region and the second polysilicon region, and a third polysilicon region formed on the insulating layer and disposed above the gap.

The invention also achieves the above-identified object by providing a display panel including a substrate and a multilayer of polysilicon formed on the substrate. The substrate includes a displaying region and a circuit driving region. The multilayer of polysilicon includes a first multilayer of polysilicon disposed in the displaying region, and a second multilayer of polysilicon disposed in the circuit driving region.

The first multilayer of polysilicon includes a first polysilicon region, a second polysilicon region and a third polysilicon region. The first polysilicon region and the second polysilicon region are spaced apart by a first gap. The third polysilicon region is disposed above the first gap. The first polysilicon region, the second polysilicon region and the third polysilicon region are insulated by a first insulating layer. A direction of a grain boundary of the third polysilicon region intersects a direction of a channel of an active layer of the displaying region at an angle.

The second multilayer of polysilicon includes a fourth polysilicon region, a fifth polysilicon region and a sixth polysilicon region. The fourth polysilicon region and the fifth polysilicon region are spaced apart by a second gap. The sixth polysilicon region is disposed above the second gap. The fourth polysilicon region, the fifth polysilicon region and the sixth polysilicon region are insulated by a second insulating layer. A direction of a grain boundary of the sixth polysilicon region is substantially parallel to a direction of a channel of an active layer of the circuit driving region.

Other objects, features, and advantages of the invention will become apparent from the following detailed description of the preferred but non-limiting embodiments. The following description is made with reference to the accompanying drawings.

BRIEF DESCRIPTION OF THE DRAWINGS

Attached FIG. 1(a) is a SEM (Scanning Electron Microscopy) image showing a polysilicon film manufactured by a continuous wave laser.

Attached FIG. 1(b) is a SEM image showing a polysilicon film manufactured by an excimer laser.

Attached FIG. 2(a) is an AFM (Atomic Force Microscopy) image showing a polysilicon film manufactured by a continuous wave laser.

Attached FIG. 2(b) is an AFM image showing a polysilicon film manufactured by an excimer laser.

Attached FIG. 3(a) is an AFM image (observed height=460 nm) showing a polysilicon film by a conventional continuous wave laser crystallization method.

Attached FIG. 3(b) is an AFM image (observed height=397 nm) showing a polysilicon film manufactured by a continuous wave laser crystallization method according to the embodiment of the invention.

Attached FIG. 4(a) is a SEM image showing a polysilicon film manufactured by the continuous wave laser crystallization method according to the embodiment of the invention.

Attached FIG. 4(b) is a locally enlarged view of the attached FIG. 4(a), wherein the grain boundary grows along a specific direction.

Attached FIG. 5 is a schematic illustration showing a method of calculating a center line average roughness Ra.

Attached FIG. 6 is a schematic illustration showing a method of calculating a maximum roughness Rt.

Attached FIG. 7 is a schematic illustration showing a method of calculating a RMS roughness Rms.

DETAILED DESCRIPTION OF THE INVENTION

Figure 2:
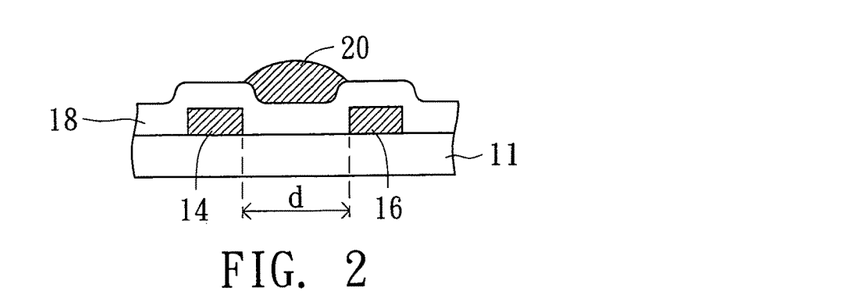
FIG. 2 is a schematic illustration showing a semiconductor structure having a multilayer of polysilicon according to a preferred embodiment of the invention.
Figure 2A:
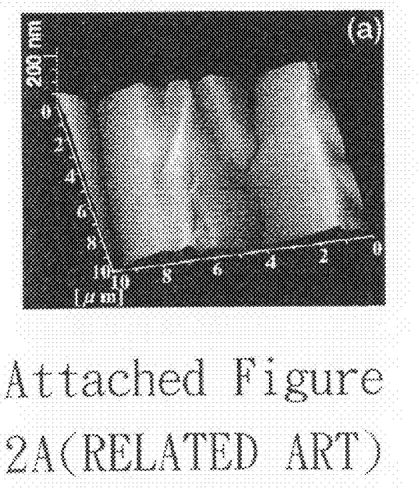
Figure 2B:
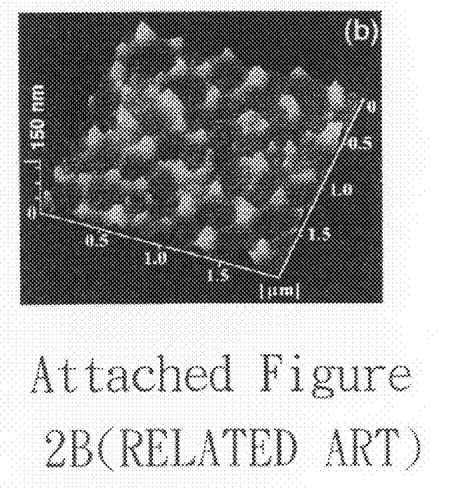

FIG. 2 is a schematic illustration showing a semiconductor structure having a multilayer of polysilicon according to a preferred embodiment of the invention. Referring to FIG. 2, the semiconductor structure includes a substrate 11, a first polysilicon region 14, a second polysilicon region 16, an insulating layer 18 and a third polysilicon region 20. The first polysilicon region 14 and the second polysilicon region 16 are formed on the substrate 11 and spaced apart by a gap d. The insulating layer 18 is formed on the substrate 11 to cover the first polysilicon region 14 and the second polysilicon region 16 and insulate the first polysilicon region 14 from the second polysilicon region 16. The third polysilicon region 20 is formed on the insulating layer 18 and disposed above the gap d.

The first polysilicon region 14, the second polysilicon region 16 and the third polysilicon region 20 of this semiconductor structure are formed by converting the amorphous silicon region using the laser annealing method. Such a structure can mainly control the temperature gradient during the laser annealing process. When the polysilicon is heated by the laser to the melting state, the polysilicon solidifies from the center to the sides so as to control the grain boundary to grow along a specific direction and decrease the height of the protrusion formed during the solidification. Consequently, the grain boundary of the formed polysilicon can grow along the specific direction, and the surface roughness is smaller than that of the conventional semiconductor structure (e.g., FIG. 1).

The method of forming the semiconductor structure will be described with reference to two embodiments of the invention.

First Embodiment

Figure 3A:
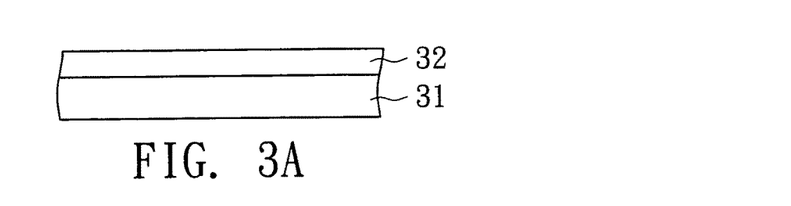
FIGS. 3A to 3E show a method of manufacturing a semiconductor structure according to a first embodiment of the invention.
Figure 3B:
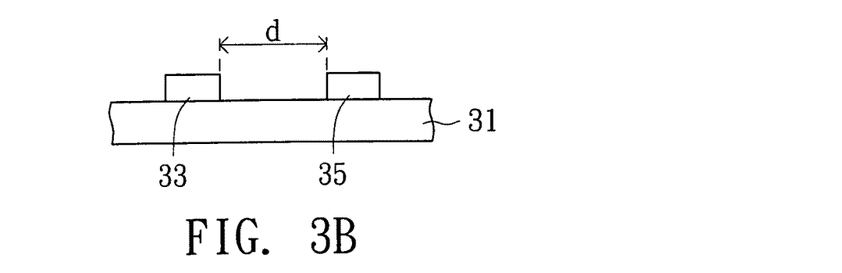

FIGS. 3A to 3E show a method of manufacturing a semiconductor structure according to a first embodiment of the invention. First, a substrate 31 is provided and then a first amorphous silicon layer 32 is formed on the substrate 31, as shown in FIG. 3A. The provided substrate 31 has a first area, a second area, and a third area located between the first and second areas, which are respectively related to the positions of the first polysilicon region 14, the second polysilicon region 16 and the third polysilicon region 20 of FIG. 2. Wherein, a first patterned polysilicon layer is constructed by the first polysilcion region 14 and the second polysilicon region 16, and a second patterned polysilicon layer is constructed by the third polysilicon region 20, respectively. Next, the first amorphous silicon layer 32 is patterned to form a first amorphous silicon region 33 and a second amorphous silicon region 35 on the substrate 31, as shown in FIG. 3B. At this time, the first amorphous silicon region 33 and the second amorphous silicon region 35 are spaced apart by a gap d.

Figure 3C:
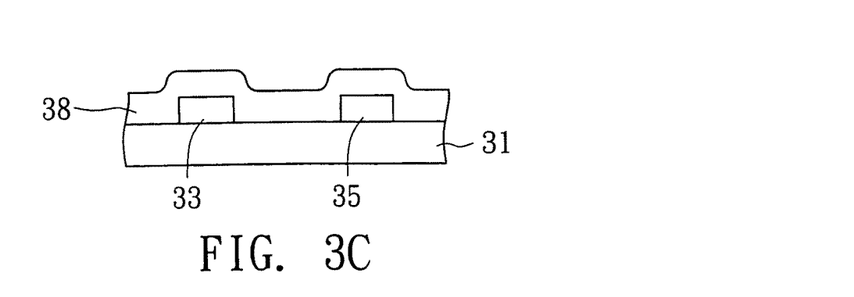
Figure 3D:
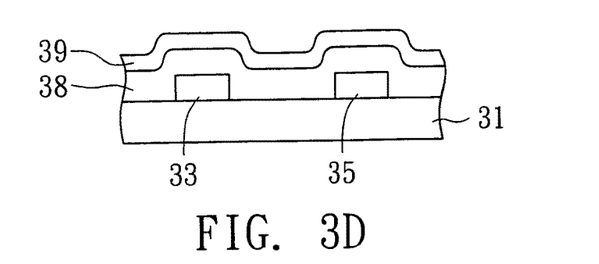
Figure 3E:
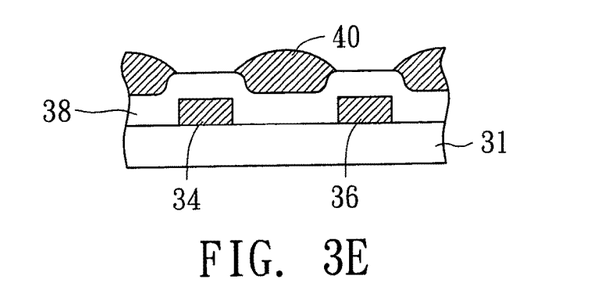

Then, an insulating layer 38 is formed on the substrate 31 to cover the first amorphous silicon region 33 and the second amorphous silicon region 35, as shown in FIG. 3C. The insulating layer 38 may be, for example, an oxide layer having a thickness ranging from about 10 nm to 500 nm. Thereafter, a second amorphous silicon layer 39 is formed on the insulating layer 38, as shown in FIG. 3D. Finally, an annealing treatment is performed to convert the first amorphous silicon region 33, the second amorphous silicon region 35 and the second amorphous silicon layer 39 into a first polysilicon region 34, a second polysilicon region 36 and a third polysilicon region 40, as shown in FIG. 3E.

In the first embodiment, it is preferred to use a continuous wave laser (CW Laser) annealing method to scan the substrate 31 in the annealing treatment step. Using the continuous wave laser to heat may melt the first amorphous silicon region 33, the second amorphous silicon region 35 (bottom layer) and the second amorphous silicon layer 39 (top layer), the liquid silicon in the second amorphous silicon layer 39 flows from a high position to a low position due to the surface tension. Then, the liquid silicon solidifies from the lower middle portion to the two sides, which can prevent the protrusion from being pressed and formed during the solidification and obtain a smooth surface. That is, the surface roughness (see the attached FIG. 3(b)) according to the crystallization of this embodiment is lower than that (see the attached FIG. 3(a)) according to the conventional crystallization. In addition, because the structure provides a specific thermal flow direction, the die grows along a specific direction to form a regular grain boundary (see the attached FIG. 4(a), and the attached FIG. 4(b)).

Second Embodiment

Figure 4A:
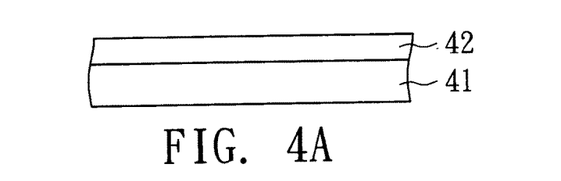
FIGS. 4A to 4F show a method of manufacturing a semiconductor structure according to a second embodiment of the invention.
Figure 4B:
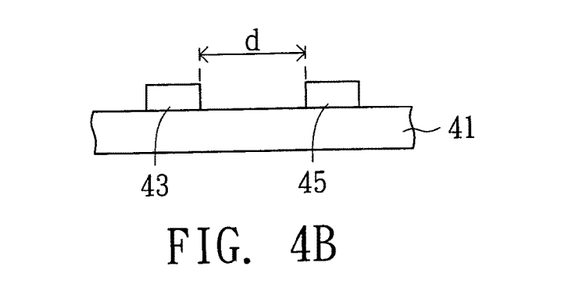

FIGS. 4A to 4F show a method of manufacturing a semiconductor structure according to a second embodiment of the invention. First, a substrate 41 is provided, and a first amorphous silicon layer 42 is formed on the substrate 41, as shown in FIG. 4A. The provided substrate 41 has a first area, a second area, and a third area located between the first and second areas, which are respectively related to the positions of the first polysilicon region 14, the second polysilicon region 16 and the third polysilicon region 20 of FIG. 2. Wherein, a first patterned polysilicon layer is constructed by the first polysilcion region 14 and the second polysilicon region 16, and a second patterned polysilicon layer is constructed by the third polysilicon region 20, respectively. Next, the first amorphous silicon layer 42 is patterned to form a first amorphous silicon region 43 and a second amorphous silicon region 45 on the substrate 41, as shown in FIG. 4B. At this time, the first amorphous silicon region 43 and the second amorphous silicon region 45 are spaced apart by a gap d.

Figure 4C:
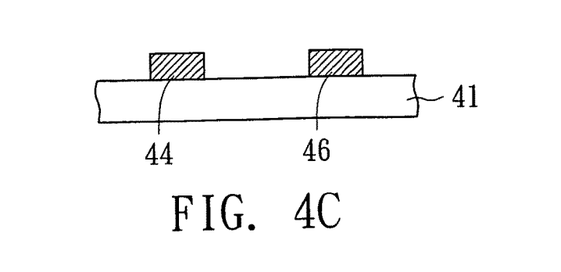

Then, the first amorphous silicon region 43 and the second amorphous silicon region 45 are crystallized to form a first polysilicon region 44 and a second polysilicon region 46, respectively, as shown in FIG. 4C. The crystallization method includes, without limitation to, the continuous wave laser annealing, the excimer laser annealing, or the pulse-type laser annealing.

Figure 4D:
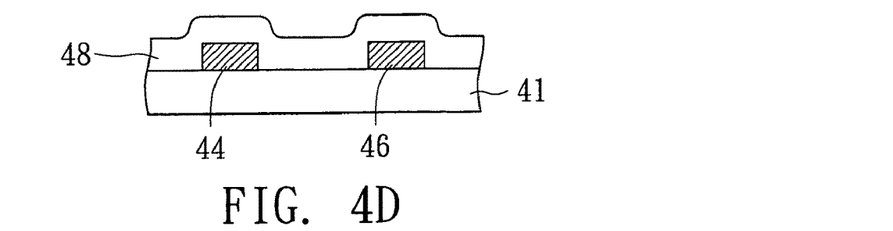
Figure 4E:
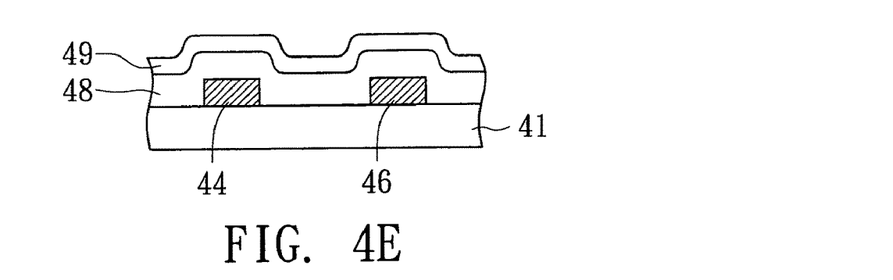
Figure 4F:
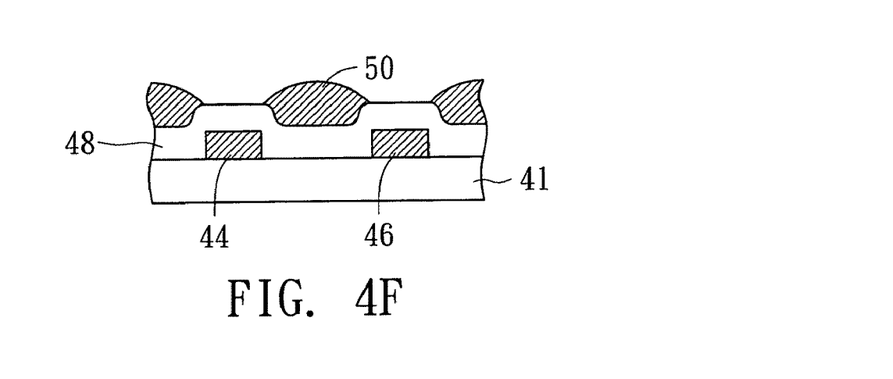

Then, an insulating layer 48 is formed on the substrate 41 to cover the first polysilicon region 44 and the second polysilicon region 46, as shown in FIG. 4D. The insulating layer 48 may be, for example, an oxide layer having a thickness substantially ranging from 10 nm to 500 nm. Thereafter, a second amorphous silicon layer 49 is formed on the insulating layer 48, as shown in FIG. 4E. Finally, an annealing treatment is performed to convert the second amorphous silicon layer 49 into a third polysilicon region 50, as shown in FIG. 4F. In the second embodiment, it is preferred to scan the substrate 41 in a pulse-type laser annealing manner to form the third polysilicon region 50.

Roughness Experiment

Measurements in the surface roughness are taken in the semiconductor structure (see FIG. 2) formed after the laser crystallization of the invention and the structure (see FIG. 1) formed after the conventional laser crystallization, and some of the measured results are shown in TABLE 1.

TABLE 1

|  | Center Line Average Roughness Ra (nm) | RMS Roughness Rms (nm) | Maximum Roughness Rmax (nm) |
| --- | --- | --- | --- |
| Prior Art Structure | 22.1 | 15.1 | 460.1 |
| The Invention Structure | 2.8 | 3.5 | 19.9 |

As shown in TABLE 1, the semiconductor structure of the invention can effectively reduce the height difference (Rt, Rmax) and the average roughness (Ra, Rms) per unit area.

According to several experimental results, it is found that the semiconductor structure of the invention formed by the method of either the first embodiment or the second embodiment has the third polysilicon region 20 with a specific orientation crystallization. The third polysilicon region 20 has a maximum roughness substantially smaller than 25 nm, and the third polysilicon region 20 has a RMS (Rms) roughness substantially smaller than 5 nm. The roughness is calculated as follows.

The center line average roughness Ra, as shown in the attached FIG. 5, is calculated by averaging the deviation absolute values between the center line and the roughness curve in the taken measurement length L along the center line of the roughness curve. The measurement length is taken by the principle of three or more than three times of the cut-off value in the JIS specification, and by the principle of five times of the cut-off value in the ISO specification. When Ra serves as a determined value of the surface, the value thereof is calculated by averaging the convex and concave values throughout the measurement length. Thus, Ra is not greatly influenced when a larger scratch is formed.

The maximum roughness Rt(Rmax), as shown in the attached FIG. 6, is obtained by calculating the maximum difference between the two parallel straight lines which pass through the peak and valley of the roughness curve respectively and are parallel to the center line in the taken reference length L.

The RMS roughness Rms(Rq), as shown in the attached FIG. 7, is obtained by squaring the deviations between the center line and the roughness curve, integrating and averaging the squared deviations in the zone of the measurement length L, and then taking a root of the average in the zone.

Figure 5:
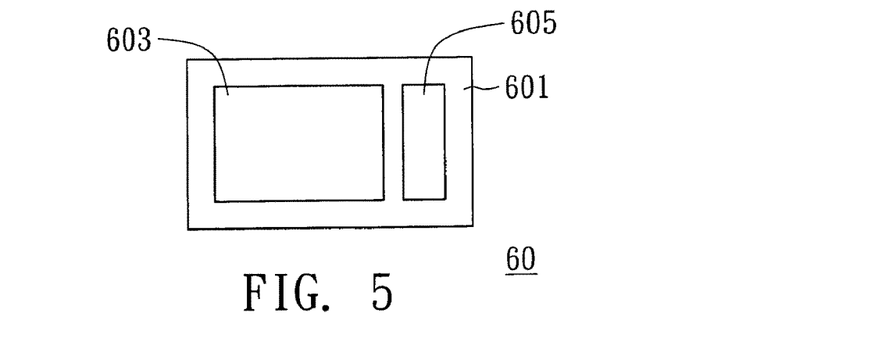
FIG. 5 is a schematic illustration showing an active display device.
Figure 6:
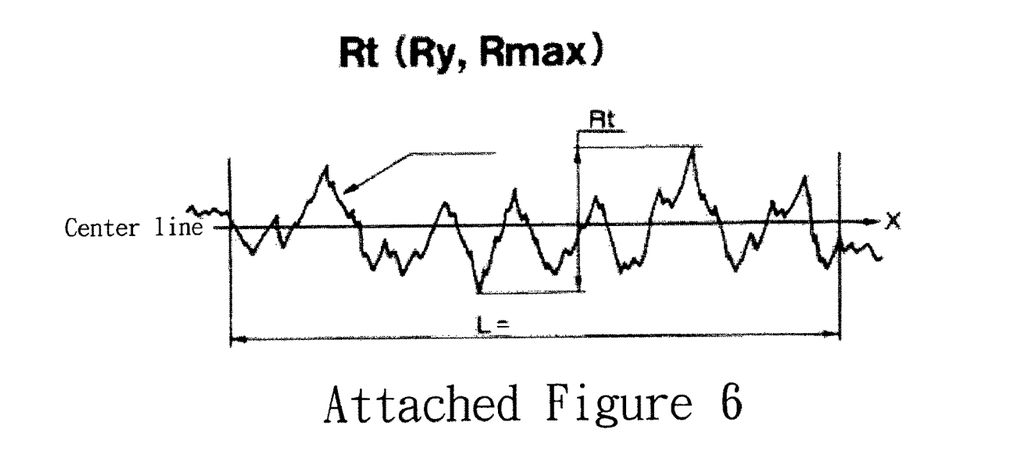
FIGS. 6A and 6B are schematic illustrations respectively showing the arrangement direction of a grain boundary and a channel of an active layer in a semiconductor structure according to an embodiment of the invention.
Figure 6A:
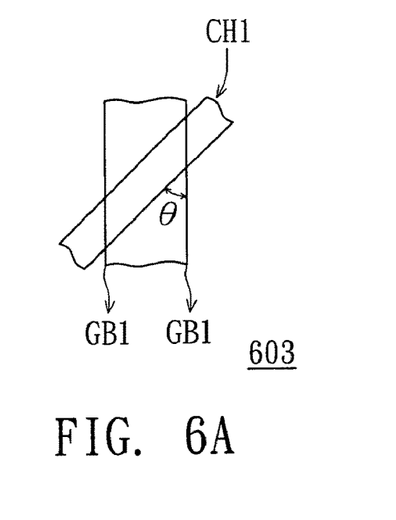
Figure 6B:
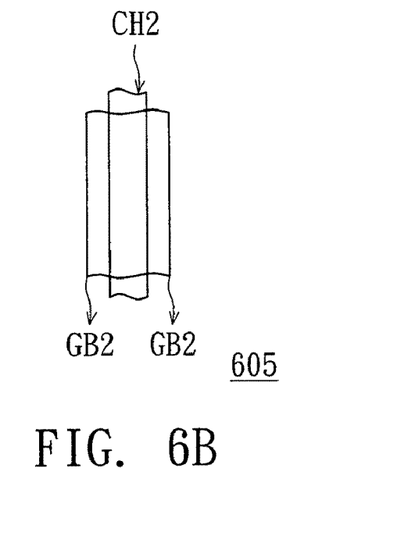

In addition, different regions in the display device have different performance requirements in practical applications. So, the polysilicon layer with an orientation crystallization of the invention can be properly arranged according to the requirements of the application elements. Please refer to FIGS. 5, 6A, 6B, 7A and 7B simultaneously. FIG. 5 is a schematic illustration showing an active display device. FIGS. 6A and 6B are schematic illustrations respectively showing the arrangement direction of a grain boundary and a channel of an active layer in a semiconductor structure according to an embodiment of the invention.

For example, in an active display device 60 as shown in FIG. 5, a substrate 601 typically includes a displaying region (or a pixel region) 603 and a circuit driving region 605.

In the displaying region 603, whether the electric uniformity is good is mostly emphasized. So, when the semiconductor structure according to an embodiment of the invention is applied to the displaying region 603, it is preferred to have the grain boundary (GB1) of the polysilicon layer with the orientation crystallization and a direction of a channel (CH1) of an active layer of the displaying region intersect at an angle (non-parallel) θ, as shown in FIG. 6A. The angle θ ranges from, for example, about 5 to 85 degrees. Of course, when the range of the angle θ is greater than 90 degrees, the angle can be regarded as (180-θ) degrees, and the (180-θ) ranges from, for example, about 5 to 85 degrees. In a preferred condition, the angle θ or (180-θ) is 45 degrees.

In the circuit driving region 605, the electric behavior of the carrier mobility is mostly emphasized, and the die size and the grain boundary regularity of the polysilicon in the circuit driving region 605 influence the carrier mobility. Hence, when the semiconductor structure according to an embodiment of the invention is applied to the circuit driving region 605, it is preferred to have the grain boundary (GB2) of the polysilicon layer with the orientation crystallization substantially parallel to a direction of a channel (CH2) of an active layer of the circuit driving region 605, as shown in FIG. 6B.

Figure 7:
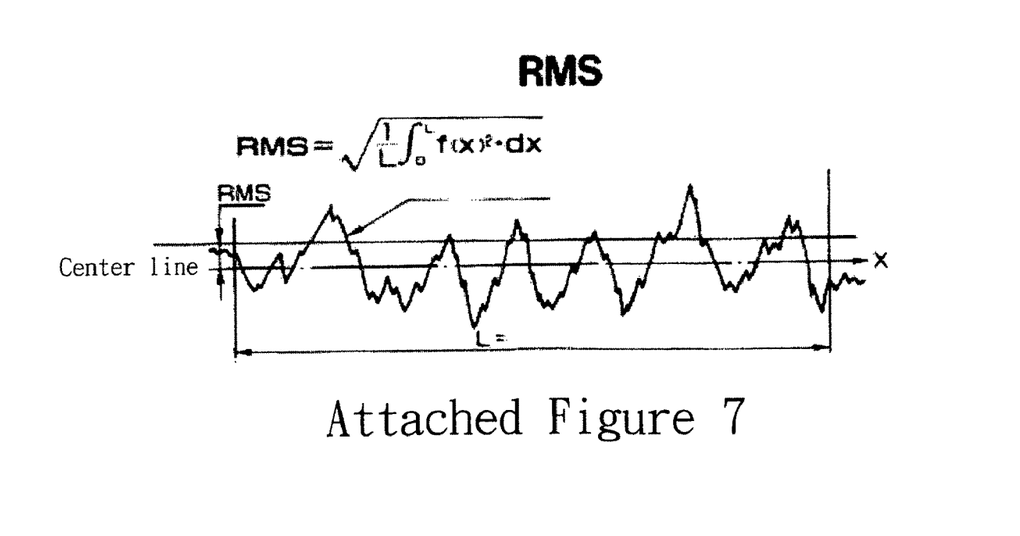
FIGS. 7A and 7B are schematically cross-sectional views respectively showing a displaying region and a circuit driving region in a semiconductor structure according to an embodiment of the invention.
Figure 7A:
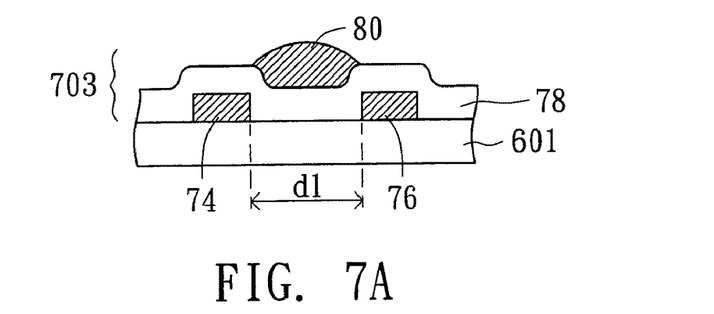
Figure 7B:
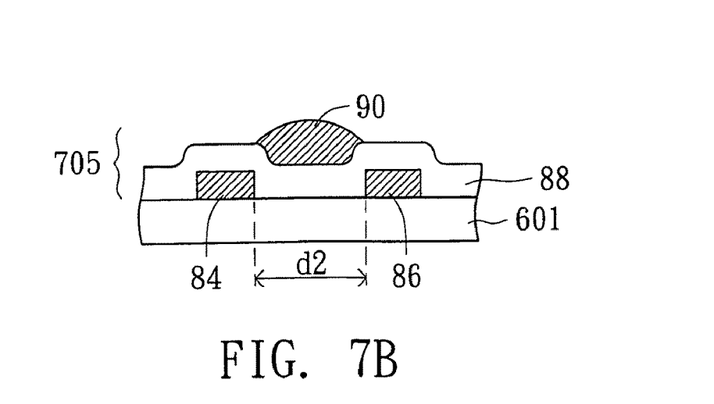

FIGS. 7A and 7B are schematically cross-sectional views respectively showing a displaying region and a circuit driving region in a semiconductor structure according to an embodiment of the invention. In the application of the displaying region 603, as shown in FIG. 7A, the semiconductor structure has a first multilayer of polysilicon 703 formed on the substrate 601. The first multilayer of polysilicon 703 includes a first polysilicon region 74, a second polysilicon region 76 and a third polysilicon region 80, and the first polysilicon region 74 and the second polysilicon region 76 are spaced apart by a first gap d1. The third polysilicon region 80 is disposed above the first gap d1, and the first polysilicon region 74, the second polysilicon region 76 and the third polysilicon region 80 are insulated from one another by a first insulating layer 78. The direction of the grain boundary of the third polysilicon region 80 intersects a direction of a channel of an active layer of the displaying region 603 at an angle.

In the application of the circuit driving region 605, as shown in FIG. 7B, the semiconductor structure has a second multilayer of polysilicon 705 formed on the substrate 601. The second multilayer of polysilicon 705 includes a fourth polysilicon region 84, a fifth polysilicon region 86 and a sixth polysilicon region 90, and the fourth polysilicon region 84 and the fifth polysilicon region 86 are spaced apart by a second gap d2. The sixth polysilicon region 90 is disposed above the second gap d2, and the fourth polysilicon region 84, the fifth polysilicon region 86 and the sixth polysilicon region 90 are insulated from one another by a second insulating layer 88. The direction of the grain boundary of the sixth polysilicon region 90 is substantially parallel to a direction of a channel of an active layer of the circuit driving region 605.

As mentioned hereinabove, the polysilicon layer of the semiconductor structure according to an embodiment of the invention has crystal with a certain orientation (i.e. regular grain boundary), such that the carrier mobility is enhanced, the surface roughness is reduced, and the electric property of the application element is enhanced.

While the invention has been described by way of examples and in terms of preferred embodiments, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A semiconductor structure, comprising:
   a substrate comprising a displaying region and a circuit driving region, wherein the display region has a first area and a second area spaced apart by a gap, and a third area located between the first area and the second area;
   a first polysilicon region formed on the first area of the substrate;
   a second polysilicon region formed on the second area of the substrate and spaced apart from the first polysilicon region by the gap;
   an insulating layer formed on the substrate to cover the first polysilicon region and the second polysilicon region, wherein the portion of the insulating layer above the first and second areas is higher than the portion of the insulating layer above the third area; and
   a third polysilicon region formed on the insulating layer and disposed above the gap, wherein a direction of a grain boundary of the third polysilicon region intersects a direction of the gap at an angle in a range from 5 degree to 85 degree.

2. The semiconductor structure according to claim 1, wherein the third polysilicon region is a polysilicon with an orientation.

3. The semiconductor structure according to claim 2, wherein when the semiconductor structure is applied to a circuit driving region of a display device, a direction of a grain boundary of the third polysilicon region is substantially parallel to a direction of a channel of an active layer of the circuit driving region.

4. The semiconductor structure according to claim 2, wherein when the semiconductor structure is applied to a displaying region of a display device, the direction of the grain boundary of the third polysilicon region intersects a direction of an active layer of the displaying region at an angle.

5. The semiconductor structure according to claim 1, wherein the third polysilicon region has a maximum roughness smaller than 25 nm.

6. The semiconductor structure according to claim 1, wherein the third polysilicon region has a RMS (Root Mean Square) roughness smaller than 5 nm.

7. A display panel, comprising:
   a substrate, which comprises a displaying region and a circuit driving region, wherein the display region has a first area and a second area spaced apart by a first gap, and a third area located between the first and second areas; and the circuit driving region has a fourth area and a fifth area spaced apart by a second gap, and a sixth area located between the fourth and fifth areas; and
   a multilayer of polysilicon formed on the substrate, the multilayer of polysilicon comprising:
   a first multilayer of polysilicon, which is positioned in the displaying region and comprises:
   a first polysilicon region, a second polysilicon region and a third polysilicon region,
   wherein the first polysilicon region and the second polysilicon region are formed on the first and second areas and spaced apart by the first gap, the third polysilicon region is disposed on the third area and above the first gap, the first polysilicon region, the second polysilicon region and the third polysilicon region are insulated by a first insulating layer, and a direction of a grain boundary of the third polysilicon region intersects a direction of the first gap at an angle in a range from 5 degree to 85 degree, wherein the portion of the first insulating layer above the first and second areas is higher than the portion of the first insulating layer above the third area; and a second multilayer of polysilicon, which is disposed in the circuit driving region and comprises:

a fourth polysilicon region, a fifth polysilicon region and a sixth polysilicon region, wherein the fourth polysilicon region and the fifth polysilicon region are formed on the fourth and fifth areas and spaced apart by the second gap, the sixth polysilicon region is disposed on the sixth area and above the second gap, the fourth polysilicon region, the fifth polysilicon region and the sixth polysilicon region are insulated by a second insulating layer, and a direction of a grain boundary of the sixth polysilicon region is substantially parallel to a direction of a channel of an active layer of the circuit driving region, wherein the portion of the second insulating layer above the fourth and fifth areas is higher than the portion of the second insulating layer above the sixth area.

8. The display panel according to claim 7, wherein each of the third polysilicon region and the sixth polysilicon region has a maximum roughness less than 25 nm.

9. The display panel according to claim 7, wherein each of the third polysilicon region and the sixth polysilicon region has a RMS (Root Mean Square) roughness less than 5 nm.

10. The display panel according to claim 7, wherein the angle between the direction of the grain boundary of the third polysilicon region and the direction of the channel of the active layer of the displaying region substantially ranges from 5 to 85 degrees.

* * * * *